United States Patent
Itasaka

(10) Patent No.: US 6,291,926 B1
(45) Date of Patent: Sep. 18, 2001

(54) PIEZOELECTRIC RESONATOR, METHOD OF MANUFACTURING THE PIEZOELECTRIC RESONATOR AND METHOD OF ADJUSTING RESONANCE FREQUENCY OF THE PIEZOELECTRIC RESONATOR

(75) Inventor: Yasuhiro Itasaka, Toyama (JP)

(73) Assignee: Murata Manufacturing Co., LTD (JP)

( * ) Notice: Subject to any disclaimer, the term of this patent is extended or adjusted under 35 U.S.C. 154(b) by 0 days.

(21) Appl. No.: 09/200,183

(22) Filed: Nov. 25, 1998

(30) Foreign Application Priority Data

Feb. 12, 1998  (JP) .................................................. 10-048796

(51) Int. Cl.[7] .................................................. H01L 41/08
(52) U.S. Cl. .......................... 310/320; 310/366; 310/367; 310/368
(58) Field of Search .................................. 310/320, 365, 310/366, 367, 368, 312

(56) References Cited

U.S. PATENT DOCUMENTS

| | | | |
|---|---|---|---|
| 3,311,760 | * | 3/1967 | Durgin et al. .................... 310/366 X |
| 3,335,299 | * | 8/1967 | Yando .................................. 310/366 |
| 3,356,850 | * | 12/1967 | Williams ........................... 310/366 X |
| 3,495,105 | * | 2/1970 | Shimano .............................. 310/366 |
| 3,833,825 | * | 9/1974 | Haan .................................... 310/320 |
| 4,217,684 | * | 8/1980 | Brisken et al. ................... 310/334 X |
| 4,425,525 | * | 1/1984 | Smith et al. ...................... 310/367 X |
| 4,431,938 | * | 2/1984 | Inoue ................................ 310/366 X |
| 4,455,502 | * | 6/1984 | Nakatani .............................. 310/366 |
| 4,503,350 | * | 3/1985 | Nakatani .......................... 310/368 X |
| 4,503,352 | * | 3/1985 | Inoue ................................ 310/368 X |
| 4,896,068 | * | 1/1990 | Nilsson ............................ 310/366 X |
| 5,969,463 | * | 10/1999 | Tomita et al. ....................... 310/320 |
| 5,973,442 | * | 10/1999 | Irie ................................... 310/321 X |
| 6,057,629 | * | 5/2000 | Nakamura et al. .................. 310/312 |

FOREIGN PATENT DOCUMENTS

| | | | | |
|---|---|---|---|---|
| 0282973 | * | 11/1988 | (JP) | ..................................... 310/366 |
| 0208408 | * | 9/1991 | (JP) | ..................................... 310/320 |

* cited by examiner

Primary Examiner—Mark O. Budd
(74) Attorney, Agent, or Firm—Keating & Bennett, LL

(57) ABSTRACT

A piezoelectric resonator vibrates in a square vibration mode and includes a piezoelectric substrate having a first major surface and a second major surface, electrodes provided on the first major surface and the second major surface of the piezoelectric substrate and a groove provided in at least one of the first major surface and the second major surface of the piezoelectric substrate. The groove divides at least one of the electrodes into a plurality of areas such that the electrostatic capacitance of the resonator is changed by varying the position, the width and the depth of the groove provided on the piezoelectric substrate.

10 Claims, 8 Drawing Sheets

PIEZOELECTRIC RESONATOR, METHOD OF MANUFACTURING THE PIEZOELECTRIC RESONATOR AND METHOD OF ADJUSTING RESONANCE FREQUENCY OF THE PIEZOELECTRIC RESONATOR

BACKGROUND OF THE INVENTION

1. Technical Field of the Invention

The present invention relates to a piezoelectric resonator, a manufacturing method thereof, and a method of adjusting a resonance frequency of such a resonator. More particularly, the present invention relates to a piezoelectric resonator vibrating in a square vibration mode and provided in a ladder type filter, an oscillator, a filter, a discriminator, or other suitable electronic component, and a method of manufacturing and adjusting a resonance frequency of such a resonator.

2. Description of Related Art

A conventional piezoelectric resonator adapted to vibrate in a square vibration mode is shown in FIG. 11.

The electrode structure of the piezoelectric resonator 51 includes a partial electrode 53 provided on a center area of one major surface of a piezoelectric substrate 52 having a square shape, and an electrode 54 provided on an entire surface of the other major surface of the piezoelectric substrate 52.

The resonance of such a piezoelectric resonator 51 is defined by the resonance frequency thereof. Moreover, the attenuation property when being used for a ladder filter or other similar electronic component is determined by the electrostatic capacitance of the piezoelectric resonator disposed therein.

Therefore, when manufacturing a piezoelectric resonator, the electrostatic capacitance or the value of the resonance frequency must be controlled.

Conventionally, the piezoelectric resonator has been manufactured as shown in FIGS. 12A to 12G.

First, electrically-conductive pastes, such as silver paste is coated almost entirely on the two major surfaces of a piezoelectric mother substrate 55. The silver paste is baked to thereby form electrodes 56 and 57 (FIGS. 12A and 12B).

Subsequently, a DC voltage is applied between the first and second major surfaces of the piezoelectric mother substrate 55 via the electrodes 56 and 57 located on the first and second major surfaces of the piezoelectric mother substrate 55. As a result, a polarization process is achieved so as to apply and define a predetermined piezoelectric characteristic of the piezoelectric mother substrate 55 (FIG. 12C).

After this, pattern printing of resist ink 58 is performed on the electrode 56 at the first major surface of the piezoelectric mother substrate 55 to provide a partial electrode pattern, and printing of resist ink 58 is performed on substantially the entire surface of electrode 57 on the second major surface of the piezoelectric mother substrate 55 to provide a partial electrode pattern (FIG. 12D).

Then, the piezoelectric mother substrate 55, which was printed with the resist ink 58, is soaked in etching liquid so as to remove via etching the electrode portion exposed from the resist ink 58 (FIG. 12E).

If the resist ink is removed, the pattern of the electrode 56 will be formed on the first major surface of the piezoelectric mother substrate 55 so as to define a partial electrode pattern, and the electrode 58 will remain over almost the entire second major surface of the piezoelectric mother substrate 55 (FIG. 12F).

Since the electrostatic capacitance of the piezoelectric resonator 51 is determined by the area of the partial electrode 53, the partial electrode 53 of the piezoelectric resonator 51 is designed so that the electrode area thereof provides a desired electrostatic capacitance.

Therefore, in the above process, resist ink 58 must be printed on the electrodes 56 with high pattern accuracy and the electrodes 56 must be accurately patterned via etching so that the area of the electrode pattern (the partial electrodes) is formed precisely according to design for providing an exact desired electrostatic capacitance (FIG. 12D).

Further, if the piezoelectric mother substrate 55 is cut so that each electrode 56 on the first major surface is centered, the partial electrodes 53 are formed on the first major surface at the center of each piezoelectric substrate 52 that is cut, and the surface electrode 54 is formed on the entire second major surface.

As a result, many piezoelectric resonators 51 adapted to vibrate in the square vibration mode as shown in FIG. 11 are manufactured simultaneously.

After manufacturing the piezoelectric resonator 51 as described above, the resonance frequency of the piezoelectric resonator 51 is measured and adjusted in the following way so that a desired resonance frequency can be obtained.

When the resonance frequency is too high, as shown in FIG. 13, the resonance frequency of the piezoelectric resonator 51 is decreased by grinding the periphery of piezoelectric resonator 51 so as to form a plurality of grooves or cuts 59 in the resonator 51.

Conversely, when a resonance frequency is too low, as shown in FIG. 14, the resonance frequency of the piezoelectric resonator 51 is increased by grinding and chamfering the corners of the piezoelectric resonator.

However, since for the above-mentioned piezoelectric resonator, the area of the partial electrode, i.e., the electrostatic capacitance of the piezoelectric resonator, is determined by pattern printing of the resist ink, in order to manufacture many varieties of piezoelectric resonators having different electrostatic capacitances, it is necessary to separately manufacture every piezoelectric resonator for which a different electrostatic capacitance is required.

Moreover, for the piezoelectric resonator manufactured as mentioned above, the periphery of the partial electrode spreads and blurs because of the resist ink bleeding at the time of pattern printing. The partial electrodes change the shape thereof due to distortions in the printing pattern of resist ink which causes degradation of the electric characteristics of the piezoelectric resonator.

Furthermore, because the partial electrode was formed by etching an electrode, using resist ink as an etching mask, the etching liquid corrodes the piezoelectric substrate and as a result, the electrical properties of the piezoelectric resonator are degraded.

Furthermore, even when the electrostatic capacitance of such a piezoelectric resonator is formed such that it deviates from designed specifications, it is difficult to finely tune the electrostatic capacitance later.

Moreover, in order to adjust the resonance frequency of the piezoelectric resonator, the periphery and especially the corners of the piezoelectric resonator must be grinded or cut off which makes the tuning of the resonance frequency difficult and labor-intensive.

Moreover, using the conventional manufacturing method, in order to form a partial electrode and a whole-surface electrode on both major surfaces of a piezoelectric resonator, many difficult processes are required, production time is long, and cost is very high.

Furthermore, after forming many partial electrodes on a large piezoelectric substrate (piezoelectric mother substrate), since the piezoelectric substrate was made by cutting every area including the partial electrode, the electric characteristics of the piezoelectric substrate degrade when the cut position deviated.

SUMMARY OF THE INVENTION

To overcome the problems described above, preferred embodiments of the present invention provide a piezoelectric resonator which does not experience degradation of its electrical characteristics during its manufacturing and also facilitate a manufacturing process and a resonance frequency adjustment process of such an improved piezoelectric resonator.

A preferred embodiment of the present invention provides a piezoelectric resonator vibrating in a square vibration mode, including a piezoelectric substrate having a first major surface and a second major surface, electrodes provided on the first major surface and the second major surface of the piezoelectric substrate, and a groove provided on at least one of the first major surface and the second major surface of the piezoelectric substrate, the groove dividing at least one of the electrodes into a plurality of areas.

In the above-described piezoelectric resonator, one area among the plurality of areas of the electrode divided by the groove may be arranged to function as a signal input electrode. The signal input electrode preferably has a symmetrical shape.

Preferred embodiments of the present invention also provide a method of adjusting a resonance frequency of a piezoelectric resonator adapted to vibrate in a square vibration mode, the piezoelectric resonator including a piezoelectric substrate having a first major surface and a second major surface, and electrodes provided on the first major surface and the second major surface of the piezoelectric substrate, the method including the steps of forming a groove on at least one of the first major surface and the second major surface of the piezoelectric substrate to thereby divide at least one of the electrodes into a plurality of areas, and varying the width or the depth of the groove to thereby adjust the resonance frequency of a piezoelectric resonator.

Preferred embodiments of the present invention further provide a method of manufacturing a piezoelectric resonator adapted to vibrate in a square vibration mode, the piezoelectric resonator including a piezoelectric substrate having a first major surface and a second major surface, and electrodes provided on the first major surface and the second major surface of the piezoelectric substrate, the method including the steps of forming the electrodes on substantially the entire first and second major surfaces, and forming a groove on at least one of the first major surface and the second major surface of the piezoelectric substrate to thereby divide at least one of the electrodes into a plurality of areas.

Preferred embodiments of the present invention also provide a method of manufacturing a piezoelectric resonator adapted to vibrate in a square vibration mode, the piezoelectric resonator including a piezoelectric substrate having a first major surface and a second major surface and electrodes provided on the first major surface and the second major surface of the piezoelectric substrate, the method including the steps of forming the electrodes on substantially the entire first and second major surface of a piezoelectric mother substrate, and forming a groove on at least one of the first major surface and the second major surface of the piezoelectric mother substrate to thereby divide at least one of the electrodes into a plurality of areas and cutting the piezoelectric mother substrate into each of a plurality of individual piezoelectric substrates.

According to the piezoelectric resonator of preferred embodiments of the present invention, the electrostatic capacitance of the resonator can be changed by varying the position, the width and the depth of the groove provided on the piezoelectric substrate.

If a piezoelectric substrate (piezoelectric mother substrate) having electrodes on substantially the entire major surfaces thereof is provided as a common component, when creating a groove on that major surface, the various piezoelectric resonators of which electrostatic capacitances and resonance frequencies are different can be manufactured by varying the position, the width and the depth of the groove.

Therefore, a piezoelectric substrate (piezoelectric mother substrate) having electrodes on substantially the whole major surfaces thereof can be a common component, and the piezoelectric resonators of which electrostatic capacitances and a resonance frequencies are different can be manufactured cheaply and easily from such common components.

Furthermore, even after the manufacturing of the piezoelectric resonator, the electrostatic capacitance thereof can be easily and accurately adjusted if the area of the electrode is decreased by widening the groove. The resonance frequency can be adjusted by increasing the width of the groove or the depth of the groove. Thus, the electrical characteristics of such a novel piezoelectric resonator can be adjusted accurately and easily in this manner.

Moreover, when one of the plurality of areas of the electrode divided by the groove functions as a signal input electrode and the signal input electrode has a symmetrical shape, the electrical characteristics of such a piezoelectric resonator are greatly improved.

Moreover, according to preferred embodiments of the present invention, the piezoelectric resonator is preferably manufactured by forming the electrodes on substantially the entire first and second major surfaces and forming a groove on at least one of the first major surface and the second major surface of the piezoelectric substrate and thereby dividing at least one of the electrodes into a plurality of areas. Therefore, a manufacturing process, time and cost required to manufacture such a piezoelectric resonator are simple, short and very low compared with the conventional method requiring pattern printing of resist ink and other complicated, expensive and time-consuming processes described above.

Furthermore, factors which degrade the electrical characteristics of a piezoelectric resonator, such as deformation of the electrode caused by distortion of the printing pattern of resist ink, alteration of the electrode shape caused by the bleeding/blur of the resist ink, the corrosion of the piezoelectric substrate by etching liquid, etc., are eliminated in preferred embodiments of the present invention because etching is not used in order to form an electrode. As a result, the electrical characteristics of a piezoelectric resonator according to preferred embodiments of the present invention are greatly improved.

Moreover, when forming a plurality of piezoelectric resonators from a piezoelectric mother substrate, the electrodes may be formed on substantially the entire first and second major surfaces of a piezoelectric mother substrate and a groove may be formed on at least one of the first major surface and the second major surface of the piezoelectric mother substrate to thereby divide at least one of the electrodes into a plurality of areas and the piezoelectric mother substrate is then cut so as to form each of a plurality of piezoelectric substrates.

By this method, the process of cutting the piezoelectric mother substrate into a plurality of piezoelectric substrates and the process of forming the groove can be performed using a single step. Therefore, the manufacturing process according to preferred embodiments of the present invention is simplified even more.

Furthermore, an undesired position gap of the groove in relation to the piezoelectric resonator does not occur easily when performing the process of cutting the piezoelectric mother substrate into a plurality of piezoelectric substrates and the formation of the groove can be performed by a single step. Therefore, degradation of the electrical characteristics of a piezoelectric resonator according to preferred embodiments of the present invention is significantly reduced.

Other features and advantages of the present invention will become apparent from the following description of preferred embodiments of the present invention which refers to the accompanying drawings.

DETAILED DESCRIPTION OF PREFERRED EMBODIMENTS

Figure 1:
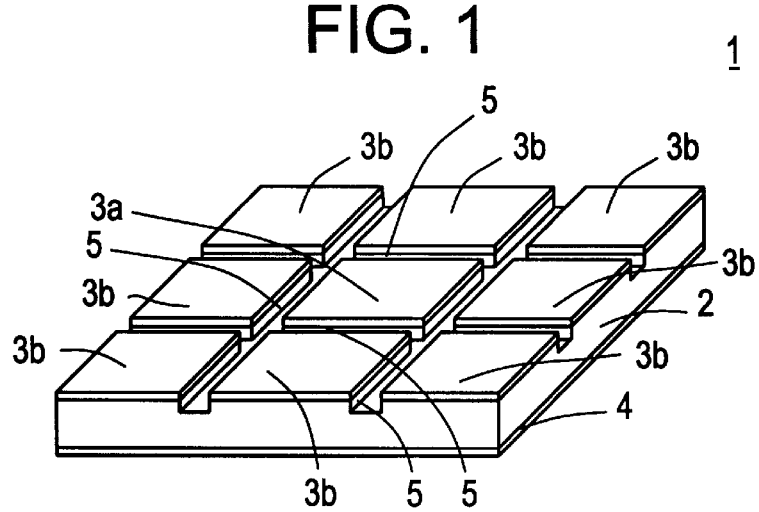
FIG. 1 is a perspective view showing the piezoelectric resonator of a preferred embodiment of the present invention.

FIG. 1 is a perspective diagram showing the piezoelectric resonator 1 adapted to vibrate in a square vibration mode according to a preferred embodiment of the present invention.

In this piezoelectric resonator 1, electrodes are disposed on an entire surface of both major surfaces (a first major surface and a second major surface) of a piezoelectric substrate 2 which is preferably formed of a polarized piezoelectric-ceramic material.

On the first major surface, electrodes 3a and 3b divided into multiple areas are formed by a plurality of linear cut grooves 5. The divided electrodes 3a and 3b are electrically insulated from each other.

Among the divided electrodes, the electrode 3a is arranged to function as a partial electrode for signal input-output of the piezoelectric resonator 1, and is positioned at the approximate center portion of the piezoelectric resonator 1. The plurality of electrodes 3b positioned along the peripheral portion of the piezoelectric resonator 1 are not connected to the line for signal input-output and do not function as electrodes of the piezoelectric resonator 1.

At substantially an entire area of the second major surface of the piezoelectric substrate 2, an electrode 4 is formed continuously and uniformly. The electrode 4 is arranged to function as a whole-surface electrode for the signal input-output of the piezoelectric resonator 1.

In such a structure of the piezoelectric resonator 1, the electrostatic capacitance of the piezoelectric resonator 1 varies with the area of the electrode (partial electrode) 3a and the electrode (whole-surface electrode) 4 which are opposed to each other via the piezoelectric substrate 2.

Therefore, the electrostatic capacitance of the piezoelectric resonator 1 can be made to vary easily by changing the position of the groove 5 cut on the piezoelectric substrate 2, and thus causing the area of electrode 3a vary.

Moreover, the resonance frequency of the piezoelectric resonator 1 can be made to vary by adjusting the depth and the width of the groove 5 which is formed on the piezoelectric substrate 2.

Specifically, if the groove 5 is made deep, the resonance frequency will be lowered, and if the width of the groove 5 is made large, the resonance frequency will be higher.

Figure 3:
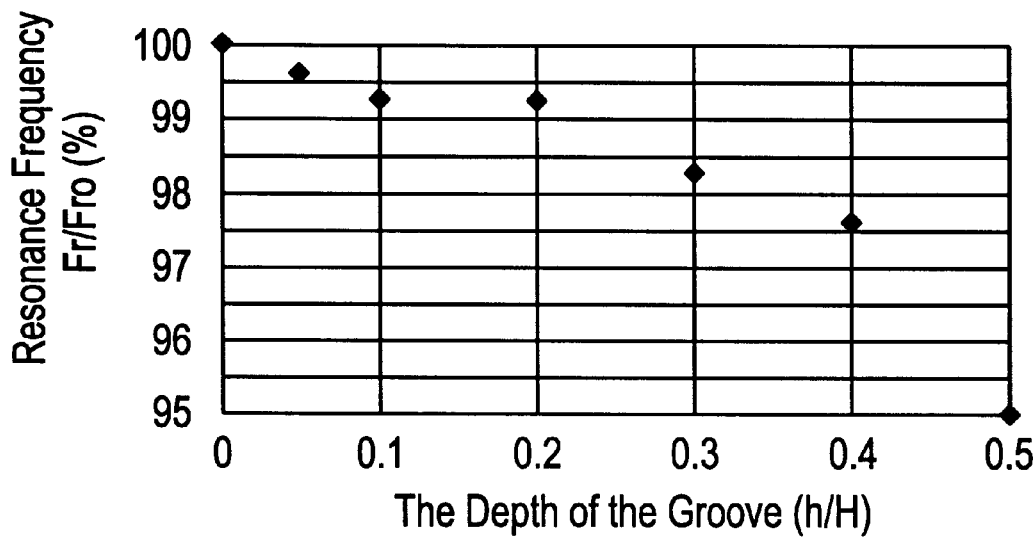
FIG. 3 is a view showing the relationship between the depth of the groove provided on the piezoelectric resonator and the variation of the resonance frequency.

An example of the change of the resonance frequency Fr when making the depth of the groove 5 vary, while keeping the width of the groove 5 constant, is shown in FIG. 3.

Figure 5:
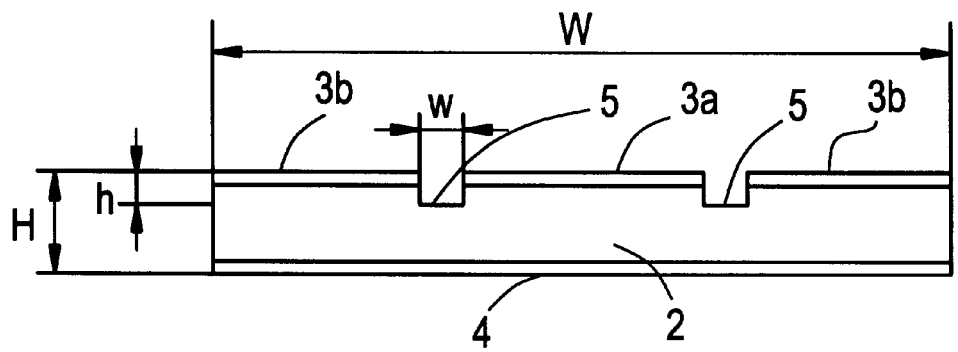
FIG. 5 is a view showing the definition of the quantities used in FIGS. 3 and 4.

FIG. 3 is a graph in which the ratio of the depth h of the groove 5 to the thickness H of piezoelectric resonator 1 (h/H) is the horizontal axis and the ratio of the resonance frequency Fr to a resonance frequency $Fr_0$ is the vertical axis. The depth h of the groove 5 and the thickness H of the piezoelectric resonator 1 is indicated in FIG. 5. The resonance frequency $Fr_0$ is the resonance frequency when there is no groove 5 (h=0).

FIG. 3 shows that the resonance frequency Fr becomes lower as the depth of the groove 5 is made deeper.

Figure 4:
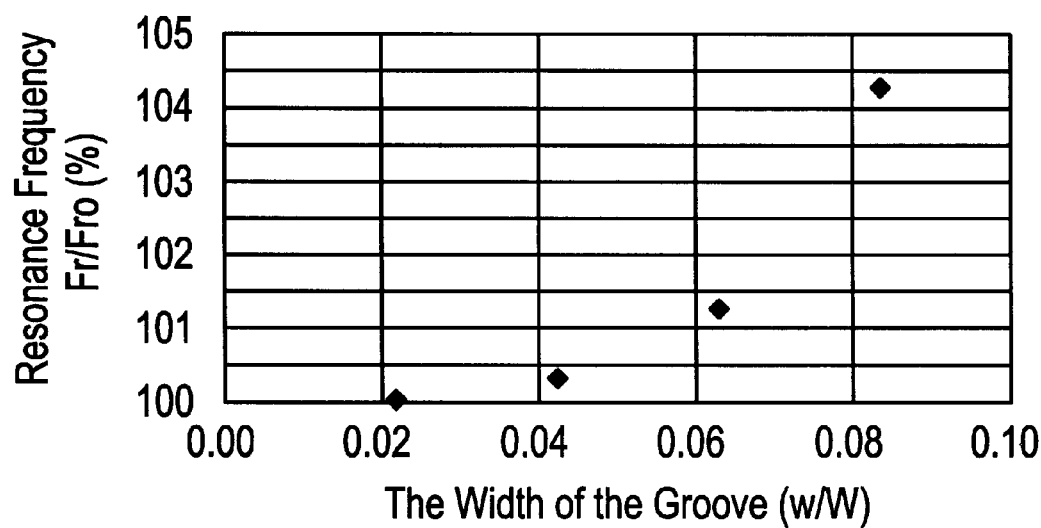
FIG. 4 is a view showing the relationship between the width of the groove provided on the piezoelectric resonator and the variation of the resonance frequency.

Moreover, an example of the change of the resonance frequency Fr when making the width of the groove 5 vary, while keeping the depth of the groove 5 constant, is shown in FIG. 4.

FIG. 4 is a graph in which the ratio of the width w of the groove 5 to the width W of the piezoelectric resonator 1 (w/W) is the horizontal axis and the ratio of the resonance frequency Fr to a resonance frequency $Fr_0$ is the vertical axis. The width of the groove 5 and the width W of the piezoelectric resonator 1 is indicated in FIG. 5. The resonance frequency $Fr_0$ is the resonance frequency when there is no groove 5 (w=0).

FIG. 4 shows that the resonance frequency Fr becomes higher as the width of the groove 5 is made larger.

Figure 2:
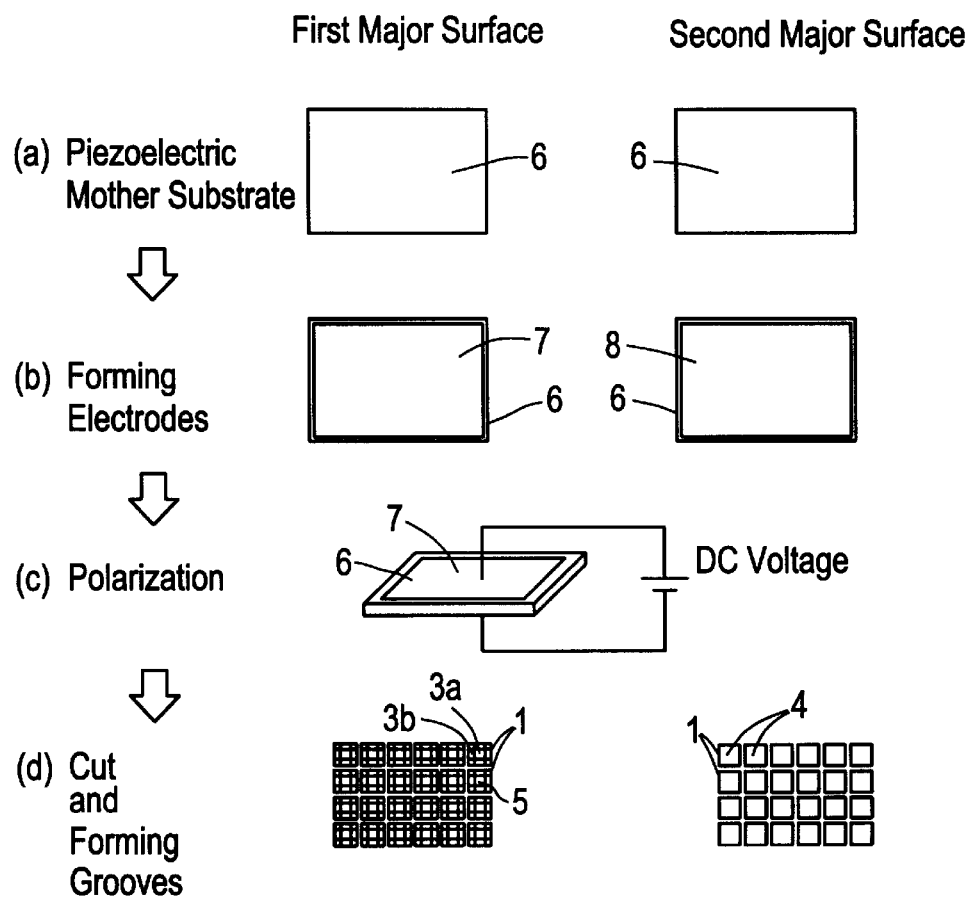
FIG. 2 is a view showing a method of manufacturing the piezoelectric resonator of FIG. 1.

In the piezoelectric resonator 1, if a common component is manufactured by forming the electrodes (the electrodes 7 and 8 in FIG. 2) on the entire surface of both major surfaces of piezoelectric substrate 2, when creating the groove 5 on that major surface, the position of the groove 5 can be easily changed to thereby change the area of electrode 3a. Therefore, the novel structure and methods of this preferred embodiment easily satisfies the demand for piezoelectric resonators having different electrostatic capacitances.

Moreover, when forming the groove 5, piezoelectric resonators 1 having various resonance frequencies are able to be manufactured by adjusting the width and depth of the groove 5.

Therefore, the piezoelectric substrate 2 which has an electrode formed on an entire surface of both major surfaces thereof can be used a common component for a plurality of piezoelectric resonators having different electrostatic capacitances and resonance frequencies. As a result, the preferred embodiments including the use of the universally usable common component in the form of the piezoelectric substrate 2 reduces the cost of manufacturing the piezoelectric resonators 1 and allows for simultaneous manufacturing of various piezoelectric resonators 1 having different electrostatic capacitances and resonance frequencies.

Moreover, when an electrostatic capacitance must be finely tuned after manufacture of an piezoelectric resonator 1, all that is required is to simply extend the groove 5 to the electrode 3a side, and to make the area of the electrode 3a small. If there is a possibility that the electrostatic capacitance may vary, the area of the electrode 3a may be enlarged slightly beforehand.

Alternatively, when the resonance frequency must be tuned finely, it is only necessary to simply increase the width of the groove 5 or to make the groove 5 deeper.

Therefore, all that is necessary is to simply cut only a surface of the piezoelectric substrate 2 to adjust the resonance frequency to accurately and easily adjust the electrostatic capacitance and resonance frequency instead of having to cut an entire thickness of the piezoelectric substrate as in the conventional method of adjusting the resonance frequency.

Next, a method of manufacturing the above-mentioned piezoelectric resonator 1 according to a preferred embodiment of the present invention is explained with reference to FIGS. 2A, 2B, 2C and 2D.

First, electrically-conductive pastes, such as a silver paste, are provided on substantially the whole first and second major surfaces of the piezoelectric mother substrate 6 which is formed of a piezoelectric material, and electrodes 7 and 8 are formed by baking the electrically-conductive pastes (FIGS. 2A and 2B).

Subsequently, a DC voltage is applied between the first and second major surfaces of the piezoelectric mother substrate 6 via the electrodes 7 and 8 to polarize the piezoelectric mother substrate 6 (FIG. 2C).

Next, the groove 5 is formed at a predetermined position of each piezoelectric resonator 1 such that the groove has a predetermined width and a predetermined depth, and at the same time, the piezoelectric mother substrate 6 is cut into each piezoelectric resonator 1 via a fine cutting apparatus such as a cutting saw (FIG. 2D).

It is noted that the process of cutting the piezoelectric mother substrate 6 into a plurality of piezoelectric resonators 1 and the process of forming the groove 5 on each piezoelectric resonator 1 may be performed separately.

Because the piezoelectric resonator 1 of preferred embodiments of the present invention is able to be manufactured in the above-described way, the manufacturing process is greatly simplified such that the time and expense required for production thereof is greatly reduced compared with the conventional method which requires forming an electrode via pattern printing, etching, etc. of resist ink.

Furthermore, factors which degrade the electrical characteristics of piezoelectric resonator 1 such as deformation of the electrode caused by distortion of the printing pattern of resist ink, blurring of the electrode shape caused by bleeding/scratching of resist ink, and the corrosion of piezoelectric substrate 2 by etching liquid etc., which causes many disadvantages in the conventional method, are eliminated in the preferred embodiments of the present invention because etching is not used to form the electrodes. As a result, the electrical characteristics of piezoelectric resonators 1 are greatly improved.

Because the process of cutting the piezoelectric mother substrate 6 into a plurality of piezoelectric resonators 1 and the process of cutting the groove 5 in the piezoelectric resonator 1 are performed via a single step, the manufacturing process according to preferred embodiments of the present invention is even more simplified.

Moreover, because available cutting apparatuses have high cutting accuracy and can perform simultaneously the process of cutting the piezoelectric mother substrate 6 into a plurality of piezoelectric resonators 1 and the process of cutting the groove 5 in the piezoelectric resonator 1, a position error or gap of the groove 5 relative to the piezoelectric resonator 1 does not occur. Consequently, degradation of the electrical characteristics of the piezoelectric resonator 1 is prevented, especially since the exact cut position of the piezoelectric mother substrate 6, the position of the groove 5, and the amount of cutting is set beforehand, Furthermore, even when fine tuning of the electrostatic capacitance or the resonance frequency is needed after manufacture of the piezoelectric resonator 1, the capacitance and resonance are able to be adjusted accurately and easily because the position, width, and the depth of the groove 5 are able to be corrected by using the above cutting apparatus.

In the piezoelectric resonator 1 shown in FIG. 1, the electrode 3a at the approximate center portion preferably has a substantially square shape.

Figure 6:
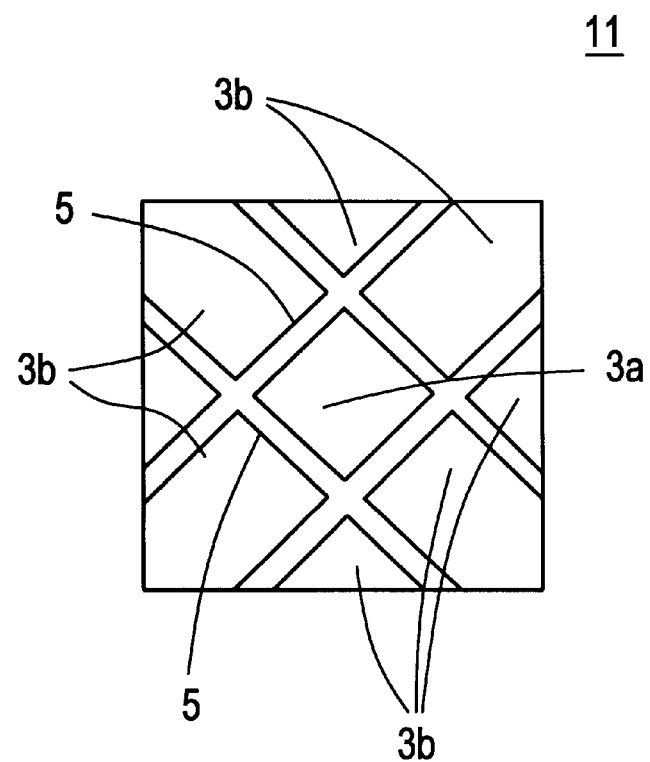
FIG. 6 plan view showing the piezoelectric resonator according to another preferred embodiment of the present invention.

The direction of the groove 5 does not have to be parallel to each edge of the piezoelectric substrate 2. As shown in FIG. 6, the electrode 3a may be formed on the approximate center section by the groove 5 which is inclined relative to each edge of the piezoelectric substrate 2.

The angle between the groove 5 and each edge of the piezoelectric substrate 2 is not necessary in order to obtain equal electrostatic capacitances if the areas of the electrodes are equal.

The electrode 3a for providing signal input-output of the piezoelectric resonator 1 adapted to vibrate in a square vibration mode can be made into any shape. However, in order to obtain an electrical characteristic without distortion, a circle or a regular polygon with many corners is desirable.

To maximize the ease of the manufacturing process and to minimize the number of the processes, a regular polygon with few corners is preferable.

Figure 7:
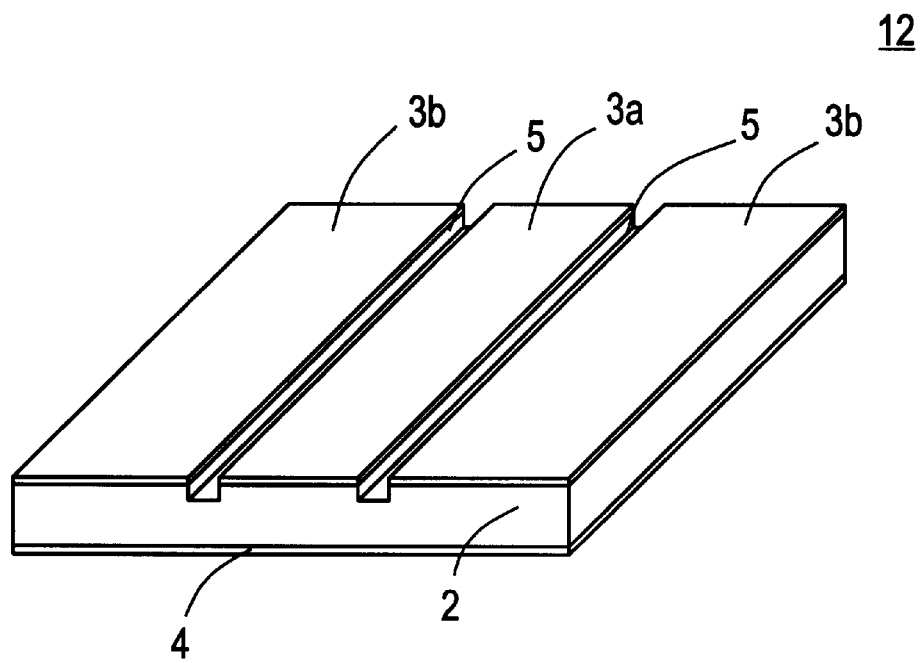
FIG. 7 is a perspective view showing the piezoelectric resonator according to another preferred embodiment of the present invention.

Moreover, to maximize the ease of a process, the groove 5 is preferably linear. Moreover, for an even more simple process, a piezoelectric resonator 1 which only has two grooves 5 arranged to be substantially parallel to each other on the piezoelectric substrate 2 is suitable as shown in FIG. 7.

In this piezoelectric resonator 1, the electrode 3a which is provided at the approximate center portion of the first major surface and the electrode 4 which is provided at the second major surface are arranged to function as signal input-outputs. The electrode 3b is electrically insulated from the groove 5, and the electrode 3b does not function as an electrode for the piezoelectric resonator 1.

The electrostatic capacitance is adjusted by the position of the groove 5 and the resonance frequency is adjusted by the depth and width of groove 5.

Figure 8:
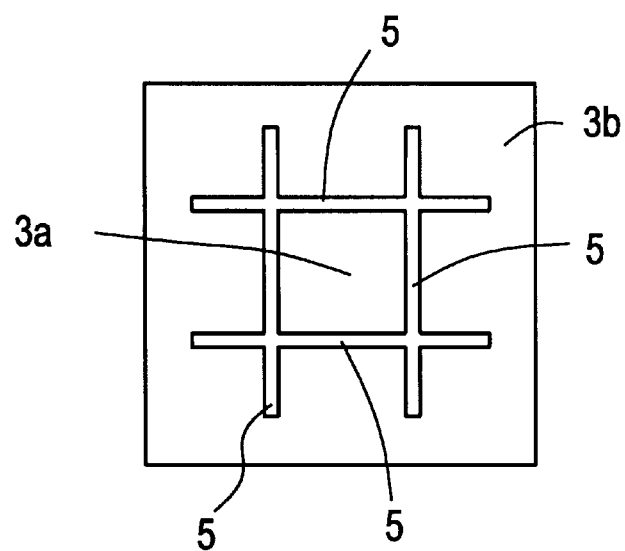
FIG. 8 is a plan view showing the piezoelectric resonator according to a further preferred embodiment of the present invention.

Moreover, the groove 5 cut into the piezoelectric substrate 2 does not have to extend from one end to the other end of the piezoelectric substrate 2. The electrode 3a and electrode 3b may be divided in the other direction as long as they are electrically insulated from each other, they may be formed partially as shown in FIG. 8, for example.

In the above described preferred embodiments, it is explained that the groove is provided only on one major surface of the piezoelectric substrate to thereby divide the electrodes disposed thereon. However, the grooves may be provided on both of two major surfaces of the piezoelectric substrate to divide the electrodes on the both of the two major surfaces, respectively.

Figure 9A:
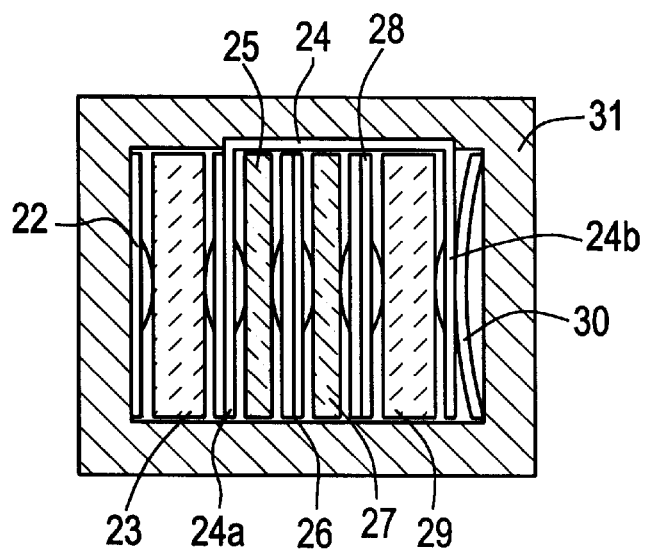
FIGS. 9A and 9B are a plan sectional view and a cross-sectional view, respectively, showing a configuration of a ladder filter using the piezoelectric resonator of preferred embodiments of the present invention.
Figure 9B:
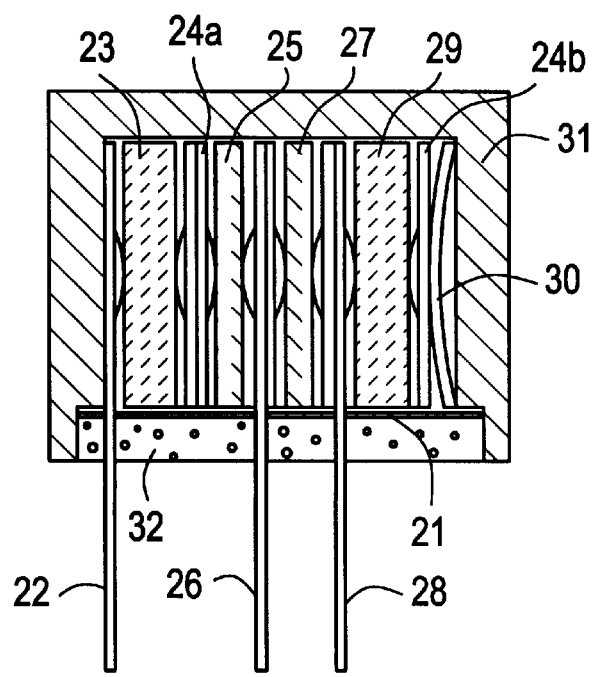
Figure 10:
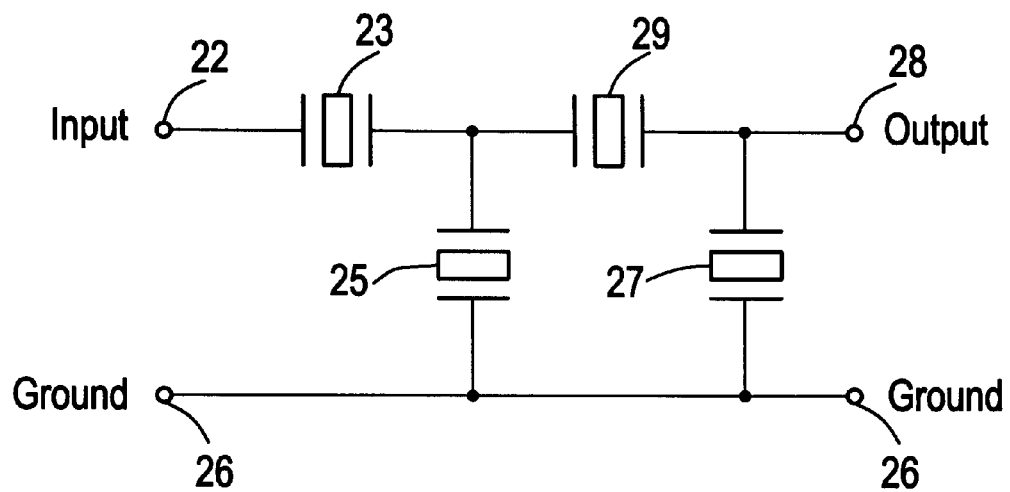
FIG. 10 is a circuit diagram of the ladder filter of FIGS. 9A and 9B.
Figure 11:
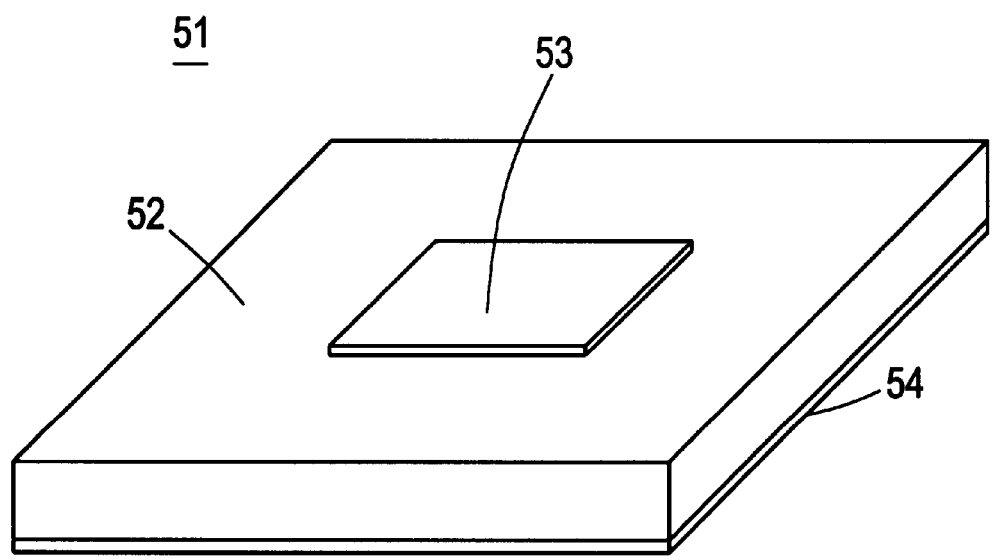
FIG. 11 is a perspective view showing a prior art piezoelectric resonator.
Figure 12:
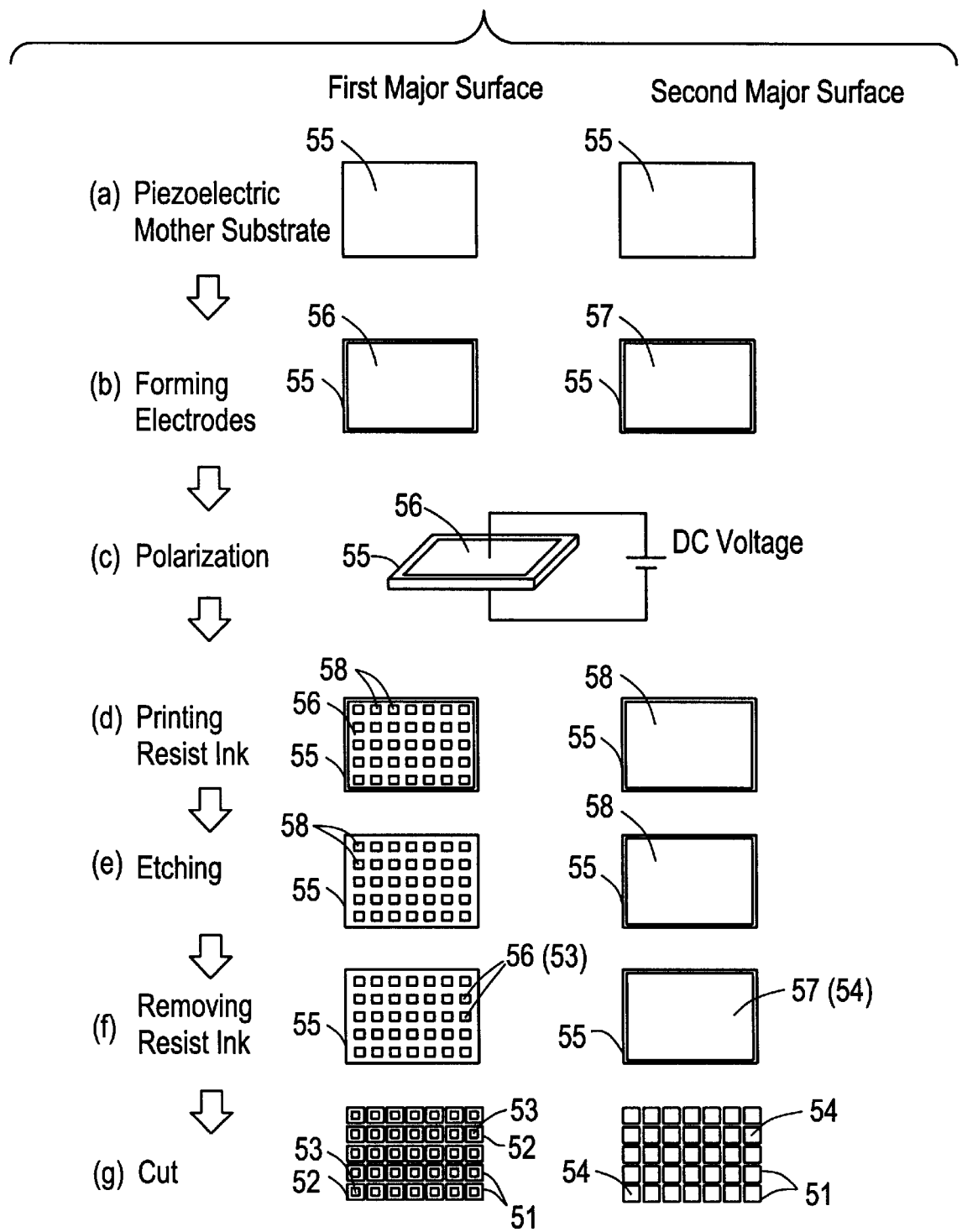
FIG. 12 is a view explaining the method of manufacturing the piezoelectric resonator of FIG. 11.
Figure 13:
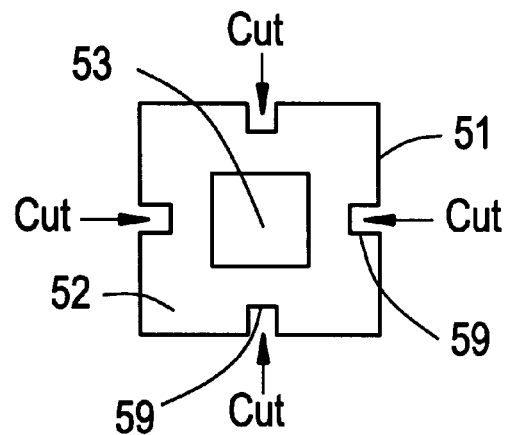
FIG. 13 is a view explaining the adjustment method of the resonance frequency of the piezoelectric resonator of FIG. 11.
Figure 14:
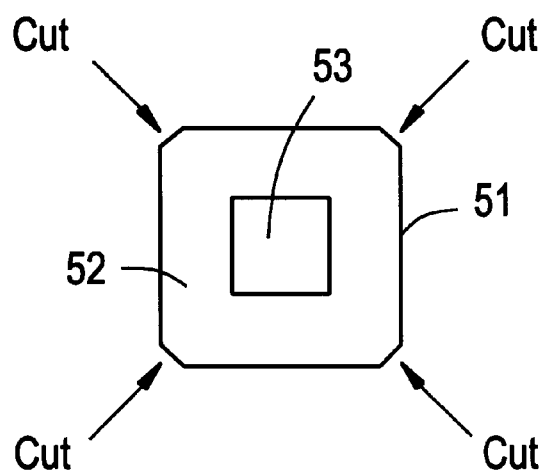
FIG. 14 is a view explaining the adjustment method of the resonance frequency of the piezoelectric resonator of FIG. 11.

FIGS. 9A and 9B are a plan sectional view and a cross-sectional view, respectively, showing the structure of the ladder filter using the piezoelectric resonator of preferred embodiments of the present invention, and FIG. 10 is a circuit diagram thereof.

An input terminal 22, a grounding terminal 26, and an output terminal 28 pass through a base 21 with a space therebetween. The base 21 is preferably made of an insulating material.

Inside a case 31 which covers the upper side of the base 21, the input terminal 22, a piezoelectric resonator 23, one partial electrode 24a of a substantially U-shaped terminal 24, a piezoelectric resonator 25, the grounding terminal 26, a piezoelectric resonator 27, the output terminal 28, a piezoelectric resonator 29, and the other partial electrode 24b of the substantially U-shaped terminal 24, are arranged.

Each piezoelectric resonator and each terminal are electrically connected because of the elastic force provided by the spring terminal 30 arranged between the other partial electrode 24b of the substantially U-shaped terminal 24 and the interior of the case 31.

Moreover, on the lower surface of the base 21, a sealing agent 32 is filled into the lower-side opening of the case 31.

Thus, among the piezoelectric resonators 23, 25, 27 and 29 used in the above described ladder filter, the piezoelectric resonators 23 and 29 are piezoelectric resonators preferably having the structure and novel features of preferred embodiments of the present invention described above. The electrostatic capacitances of the piezoelectric resonators 23 and 29 are smaller than that of piezoelectric resonators 25 and 27.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator, comprising:
   a piezoelectric substrate having a substantially square shape, a first major surface and a second major surface, and vibrating in a square vibration mode;
   at least two electrodes each being provided on a respective one of the first major surface and the second major surface of the piezoelectric substrate; and
   a first plurality of grooves provided in at least one of the first major surface and the second major surface of the piezoelectric substrate, the first plurality of grooves dividing at least one of the at least two electrodes into a plurality of separate areas, the first plurality of grooves extending in two directions which are substantially perpendicular to each other, the plurality of separate areas including at least one centrally located area arranged to define an electrostatic capacitance of the resonator and to define an input-output electrode of the resonator, wherein the at least one centrally located electrode is the only input-output electrode located on said at least one of the first major surface and the second major surface of the piezoelectric substrate such that the remainder of said plurality of separate areas are not connected to a line for signal input-output and do not function as electrodes of the piezoelectric resonator.

2. The piezoelectric resonator according to claim 1, wherein one of the plurality of areas of the one of the at least two electrodes divided by the plurality of grooves is a signal input electrode and has a symmetrical shape.

3. The piezoelectric resonator according to claim 1, wherein the resonator further comprising a second plurality of grooves provided in the other of the at least one of the first major surface and the second major surface of the piezoelectric substrate to divide the other of the at least two electrodes into a plurality of areas.

4. The piezoelectric resonator according to claim 1, wherein the plurality of areas are substantially square.

5. The piezoelectric resonator according to claim 1, wherein the first plurality of grooves extend through the at least one of the at least two electrodes and into the piezoelectric substrate.

6. The piezoelectric resonator according to claim 1, wherein the first plurality of grooves define a matrix pattern of the plurality of areas of the at least one of the at least two electrodes.

7. The piezoelectric resonator according to claim 1, wherein the first plurality of grooves extend to an edge of the piezoelectric substrate.

8. The piezoelectric resonator according to claim 1, wherein the first plurality of grooves a plurality of electrodes which are electrically insulated from each other.

9. The piezoelectric resonator according to claim 2, wherein the input electrode is located at an approximate center of the piezoelectric substrate.

10. The piezoelectric resonator according to claim 1, wherein the other of the at least two electrodes disposed on the other of the at least one of the first major surface and the second major surface of the piezoelectric substrate which does not have the first plurality of grooves formed therein extends along an entire surface of the other of the at least one of the first major surface and the second major surface of the piezoelectric substrate which does not have the first plurality of grooves formed therein.

* * * * *